United States Patent
Ko et al.

(10) Patent No.: US 8,569,882 B2
(45) Date of Patent: Oct. 29, 2013

(54) INTEGRATED CIRCUIT PACKAGING SYSTEM WITH COLLAPSED MULTI-INTEGRATION PACKAGE AND METHOD OF MANUFACTURE THEREOF

(75) Inventors: WonJun Ko, Sungnam-Si (KR); Sungmin Song, Inchon (KR); Jong Wook Ju, Icheon-Si (KR); JaEun Yun, Ichon (KR); Hye Ran Lee, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 32 days.

(21) Appl. No.: 13/071,397

(22) Filed: Mar. 24, 2011

(65) Prior Publication Data

US 2012/0241980 A1 Sep. 27, 2012

(51) Int. Cl.
*H01L 23/34* (2006.01)

(52) U.S. Cl.
USPC ........... 257/724; 257/723; 257/686; 438/107; 438/110

(58) Field of Classification Search
USPC .......... 257/686, 777, 723, 724; 438/107, 108, 438/109, 110
See application file for complete search history.

(56) References Cited

U.S. PATENT DOCUMENTS

| | | | | |
|---|---|---|---|---|
| 6,979,895 | B2 * | 12/2005 | Akram et al. | 257/686 |
| 7,224,058 | B2 * | 5/2007 | Fernandez | 257/707 |
| 7,435,619 | B2 | 10/2008 | Shim et al. | |
| 7,608,921 | B2 | 10/2009 | Pendse | |
| 7,749,807 | B2 * | 7/2010 | Karnezos | 438/109 |
| 7,795,719 | B2 * | 9/2010 | Kim et al. | 257/686 |
| 7,807,510 | B2 * | 10/2010 | Kobayashi | 438/124 |
| 2008/0105962 | A1 | 5/2008 | Lee et al. | |
| 2008/0227238 | A1 | 9/2008 | Ko et al. | |
| 2009/0115043 | A1 | 5/2009 | Chow et al. | |

* cited by examiner

*Primary Examiner* — Sheila V Clark
(74) *Attorney, Agent, or Firm* — Ishimaru & Associates LLP; I-Chang John Yang

(57) ABSTRACT

A method of manufacture of an integrated circuit packaging system includes: providing a base substrate; mounting a central integrated circuit over the base substrate; mounting a side package having a side package substrate along a peripheral region of the base substrate and laterally peripheral to the central integrated circuit with the side package substrate coplanar with the central integrated circuit; and encapsulating the central integrated circuit and the side package above the base substrate with a base encapsulation to form a planar surface over the central integrated circuit and the side package facing away from the base substrate.

17 Claims, 4 Drawing Sheets

INTEGRATED CIRCUIT PACKAGING SYSTEM WITH COLLAPSED MULTI-INTEGRATION PACKAGE AND METHOD OF MANUFACTURE THEREOF

TECHNICAL FIELD

The present invention relates generally to an integrated circuit packaging system and more particularly to a system for multi-integration package.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace. Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; mounting a central integrated circuit over the base substrate; mounting a side package having a side package substrate along a peripheral region of the base substrate and laterally peripheral to the central integrated circuit with the side package substrate coplanar with the central integrated circuit; and encapsulating the central integrated circuit and the side package above the base substrate with a base encapsulation to form a planar surface over the central integrated circuit and the side package facing away from the base substrate.

The present invention provides an integrated circuit packaging system including: a base substrate; a central integrated circuit mounted over the base substrate; a side package having a side package substrate mounted along a peripheral region of the base substrate and laterally peripheral to the central integrated circuit with the side package substrate coplanar with the central integrated circuit; and a base encapsulation encapsulating the central integrated circuit and the side package above the base substrate and forming a planar surface over the central integrated circuit and the side package facing away from the base substrate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
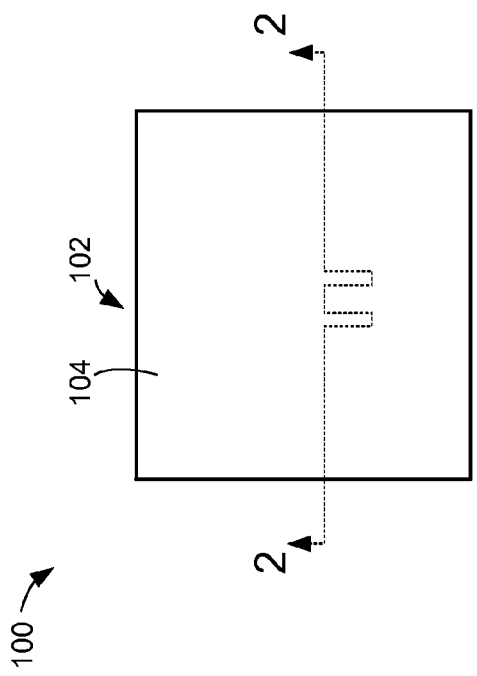
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The embodiments have been numbered first embodiment, second embodiment, etc. as a matter of descriptive convenience and are not intended to have any other significance or provide limitations for the present invention. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having a stacked package 102 with a stacked package encapsulation 104.

Figure 2:
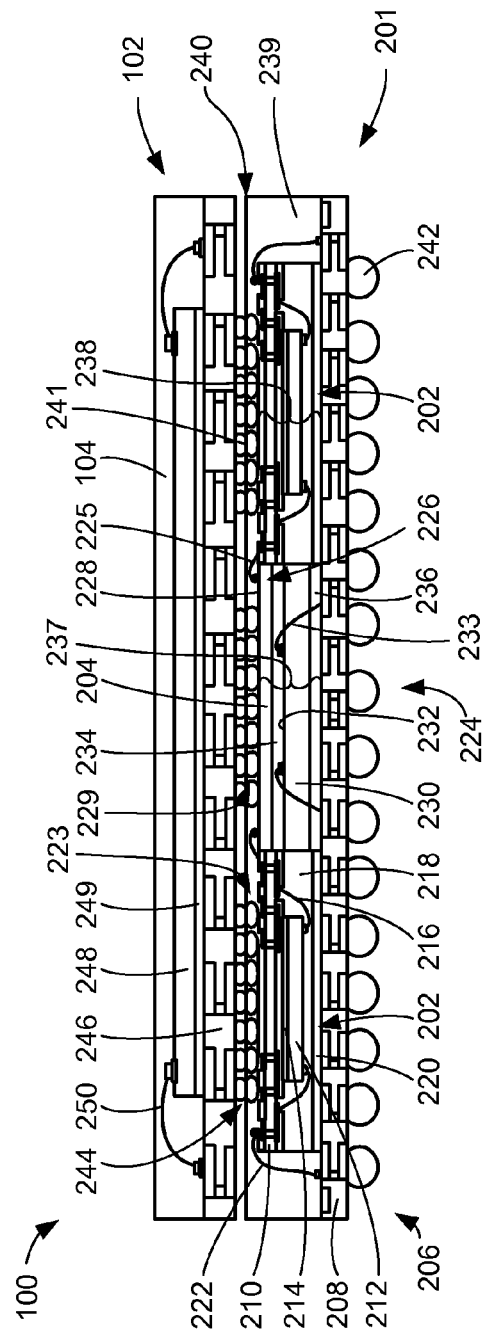
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a base package 201. The base package 201 includes side packages 202 and a central integrated circuit 204, for example. As an exemplary illustration, the integrated circuit packaging system 100 can generally be used within a portable electronic device that requires a high level of functional integration, such as a cellphone or computer. Furthermore, by way of example, the integrated circuit packaging system 100 can be referred to as a collapsed multi-integration package structure.

The side packages 202 are integrated circuit packages mounted on a peripheral region 206 of a base substrate 208. For the purposes of this application, substrate is defined as a physical material on which a microcircuit device is fabricated. The base substrate 208 can be a laminated plastic, ceramic, glass, or ferrite substrate.

The side packages 202 can be integrated circuit packages including a side package substrate 210, and can be a laminated plastic, ceramic, glass, or ferrite substrate. The side packages 202 may also include a side package integrated circuit 212 mounted below the side package substrate 210 and attached with an adhesive 214. For the purposes of this application, adhesive is defined as a substance used to bond two or more solid elements so that they may be used as a single piece. The adhesive 214 can be a resin, glue, paste, cement, putty, or a polyvinyl resin emulsion.

The side package integrated circuit 212 can be electrically connected to the side package substrate 210 with side package interconnects 216. The side package interconnects 216 can be bond wires made from gold or aluminum and attached to a side package integrated circuit 212 and the side package substrate 210 with thermal compression or ultrasonic welding.

The side packages 202 are further shown having a side package encapsulation 218. The side package encapsulation 218 encapsulates the side package integrated circuit 212 and the side package interconnects 216 below the side package substrate 210. For the purposes of this application, encapsulation is defined as a structure that protects sensitive components from moisture, dust and other contamination. The side package encapsulation 218 can be glob top, film assist molding, or other encasement structure.

It has been discovered that employment of the side packages 202 improves end line production yield. This is accomplished by using side packages 202 that are self-contained and can be tested to ensure that these are known good packages prior to integration and mounting into the integrated circuit packaging system 100.

The side packages 202 are shown mounted to the base substrate 208 with a second adhesive 220. The second adhesive 220 can be a resin, glue, paste, cement, putty, or a polyvinyl resin emulsion used to mechanically secure the side packages 202 to the base substrate 208. The side packages 202 are mounted with the side package encapsulation 218 facing the base substrate 208 and the side package substrate 210 facing away from the base substrate 208. The side packages 202 can be electrically connected from above with first interconnects 222. The first interconnects 222 can be bond wires made from gold or aluminum and attached to the side package substrate 210 and the base substrate 208 with thermal compression or ultrasonic welding along the peripheral region 206 of the base substrate 208.

Formed above the side packages 202 are first vertical connectors 223. The first vertical connectors 223 can be solder balls, copper pillars, or other conductive interconnects suitable for vertical connection while providing a standoff height for connections within the integrated circuit packaging system 100.

It has been unexpectedly found that the first vertical connectors 223 increase input/output (I/O) count of the integrated circuit packaging system 100 when used in conjunction with the side packages 202. This further allows for increased integrated circuit density, greater functionality, and greater design flexibility of the integrated circuit packaging system 100.

The side packages 202 are mounted laterally peripheral to the central integrated circuit 204. The central integrated circuit 204 can be mounted above a central region 224 of the base substrate 208. The central region 224 is not necessarily at the center of the integrated circuit packaging system 100 but the intended to depict that it is a region between the location of the side packages 202. The central integrated circuit 204 is electrically connected to the side packages 202 with second interconnects 225 along outer edges 226 and on an active side 228 of the central integrated circuit 204. The active side 228 has of the central integrated circuit 204 has active circuitry fabricated thereon and is shown mounted facing away from the base substrate 208. For the purposes of this application, active circuitry is defined as including transistor elements.

The central integrated circuit 204 can be bridge connected to the base substrate 208 by routing signals through the second interconnects 225, through the side package substrates 210, and through the first interconnects 222 to the base substrate 208. For the purposes of this application, bridge connection is defined as an electrical connection utilizing elements that serve as a redistribution layer across disparate devices.

The side packages 202 may be bridge connected together through the first interconnects 222 and through the base substrate 208 to electrically connect the side packages 202 mounted on the peripheral regions 206 together. The side packages 202 may also be bridge connected by the second interconnects 225 and through the central integrated circuit 204. In this example, the central integrated circuit 204 is a disparate device and serves as a redistribution layer.

The active side 228 of the central integrated circuit 204 is further shown having second vertical connectors 229 formed thereon. The second vertical connectors 229 can be solder balls, copper pillars, or other conductive interconnects suitable for vertical connection while providing a standoff height for connections within the integrated circuit packaging system 100.

It has been unexpectedly found that the second vertical connectors 229 above the central integrated circuit 204 increases input/output (I/O) count of the integrated circuit packaging system 100 when used in conjunction with the central integrated circuit 204. This further allows for increased integrated circuit density, greater functionality, and greater design flexibility of the integrated circuit packaging system 100.

The central integrated circuit 204 is further shown mounted above a base integrated circuit 230. The base integrated circuit 230 can be a wire-bonded die having an active side 232 with active circuitry fabricated thereon. The active side 232 of the base integrated circuit 230 faces away from the base substrate 208 and is connected thereto with third interconnects 233.

The third interconnects 233 can be bond wires made from gold or aluminum and attached to the active side 232 of the base integrated circuit 230 and the base substrate 208 with thermal compression or ultrasonic welding. The central integrated circuit 204 can be attached to the active side 232 of the base integrated circuit 230 with a third adhesive 234. The third adhesive 234 can be a resin, glue, paste, cement, putty, or a polyvinyl resin emulsion.

The third interconnects 233 connecting the base integrated circuit 230 can be connected to the base integrated circuit 230 beyond a horizontal edge of the central integrated circuit 204 so that the third interconnects 233 do not make contact with the central integrated circuit 204. A fourth adhesive 236 is shown attaching the base integrated circuit 230 to the base substrate 208. The fourth adhesive 236 can be a resin, glue, paste, cement, putty, or a polyvinyl resin emulsion.

The base integrated circuit 230 may be bridge connected to the side packages 202 through the third interconnects 233, through the base substrate 208, and through the first interconnects 222. The base integrated circuit 230 may also be bridge connected to the central integrated circuit 204 through the base substrate 208, the first interconnects 222, the side packages 202, and the second interconnects 225.

The side package substrates 210 are shown in direct contact with the central integrated circuit 204. The side package substrates 210 can induce a compressive stress in the central integrated circuit 204. The compressive stress induced within the central integrated circuit 204 can prevent decoupling between the central integrated circuit 204 and the second vertical connectors 229.

The direct contact between the side package substrates 210 and the central integrated circuit 204 can provide alignment or positioning of the first vertical connectors 223 and the second vertical connectors 229. The alignment of the first vertical connectors 223 and the second vertical connectors 229 can be from ensuring dimensions of the side packages 202 and of the central integrated circuit 204.

The central integrated circuit 204 has a height 237 from the base substrate 208 to the active side 228 of the central integrated circuit 204. The height 237 of the central integrated circuit 204 is the same as a height 238 from the base substrate 208 to the top of the side package substrate 210.

The side packages 202 and the central integrated circuit 204 can be encapsulated with a base encapsulation 239. The base encapsulation 239 is an encapsulation and can be glob top, film assist molding, or other encasement structure. The base encapsulation 239 forms a planar surface 240 with the first vertical connectors 223 and the second vertical connectors 229.

It has been unexpectedly found that the planar surface 240 makes it possible to achieve a very low profile of the integrated circuit packaging system 100. This very low profile has been discovered to improve integration of the integrated circuit packaging system 100 into portable electronic device that require slim designs along with a high level of functional integration, such as a cellphone or computer.

The base encapsulation 239 is shown encapsulating the first vertical connectors 223 above the side packages 202 and also encapsulates the second vertical connectors 229 above the central integrated circuit 204. The first vertical connectors 223 and the second vertical connectors 229 are exposed from the planar surface 240 and form connection points 241 for connection to the stacked package 102 or alternatively to other external components (not shown).

Within the integrated circuit packaging system 100 the side packages 202 and the central integrated circuit 204 are shown having co-planar surfaces. The connection points 241 can be bridge connected to the side packages 202, to the central integrated circuit 204, to the base substrate 208, or to the base integrated circuit 230.

It has been discovered that designing the central integrated circuit 204 and the side packages 202 having co-planar surfaces decreases processing time since a standard size of vertical connectors can be used. Since the first vertical connectors 223 and the second vertical connectors 229 have the virtue of being the same size, they may also be made during the same phase of manufacture.

It has been unexpectedly found that that designing the co-planar surfaces of the central integrated circuit 204 and the side packages 202 decreases the length of the second interconnects 225. Decreasing the length of the second interconnects 225 between the central integrated circuit 204 and the side packages 202 decreases parasitic inductance within the second interconnects 225 and allows for more robust transmission of high frequency signals.

Below the base substrate 208 are mounted external interconnects 242 such as solder balls. The stacked package 102 is shown mounted above the planar surface 240 and electrically connected thereto with solder balls 244. The stacked package 102 is shown having a stacked package substrate 246 with a stacked package integrated circuit 248 attached thereto with a stacked package adhesive 249. The stacked package integrated circuit 248 is electrically connected from above to the stacked package substrate 246 with stacked package interconnects 250. The stacked package interconnects 250 can be bond wires made from gold or aluminum and attached with thermal compression or ultrasonic welding. The stacked package encapsulation 104 encapsulates the stacked package integrated circuit 248 and the stacked package interconnects 250.

Figure 3:
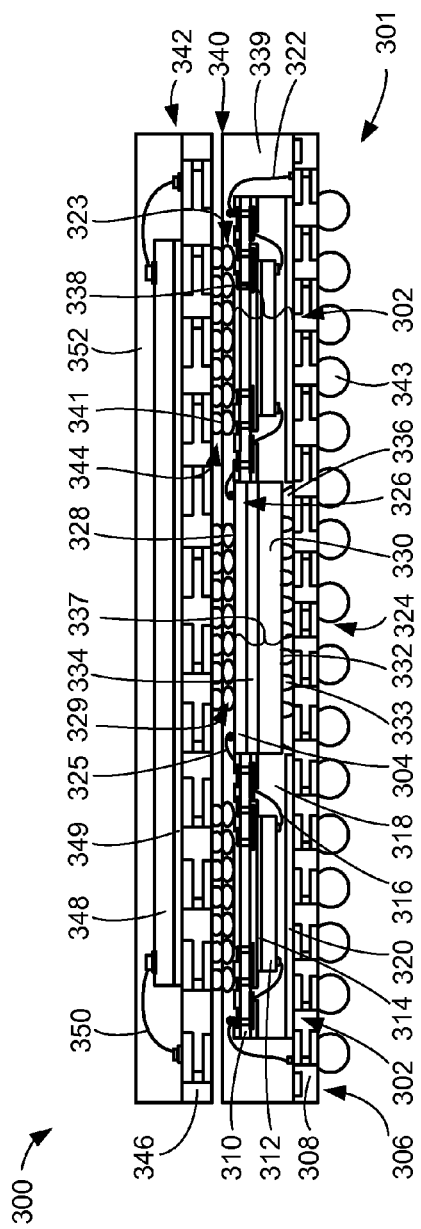
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 is shown having a base package 301. The base package 301 includes side packages 302 and a central integrated circuit 304, for example. As an exemplary illustration, the integrated circuit packaging system 300 can generally be used within a portable electronic device that requires a high level of functional integration, such as a cellphone or computer. Furthermore, by way of example, the integrated circuit packaging system 300 can be referred to as a collapsed multi-integration package structure.

The side packages 302 are integrated circuit packages mounted on a peripheral region 306 of a base substrate 308. For the purposes of this application, substrate is defined as a physical material on which a microcircuit device is fabricated. The base substrate 308 can be a laminated plastic, ceramic, glass, or ferrite substrate.

The side packages 302 can be integrated circuit packages including a side package substrate 310, and can be a laminated plastic, ceramic, glass, or ferrite substrate. The side packages 302 may also include a side package integrated circuit 312 mounted below the side package substrate 310 and attached with an adhesive 314. For the purposes of this application, adhesive is defined as a substance used to bond two or more solid elements so that they may be used as a single piece. The adhesive 314 can be a resin, glue, paste, cement, putty, or a polyvinyl resin emulsion.

The side package integrated circuit 312 can be electrically connected to the side package substrate 310 with side package interconnects 316. The side package interconnects 316 can be bond wires made from gold or aluminum and attached to a side package integrated circuit 312 and the side package substrate 310 with thermal compression or ultrasonic welding.

The side packages 302 are further shown having a side package encapsulation 318. The side package encapsulation 318 encapsulates the side package integrated circuit 312 and the side package interconnects 316 below the side package substrate 310. For the purposes of this application, encapsulation is defined as a structure that protects sensitive components from moisture, dust and other contamination. The side package encapsulation 318 can be glob top, film assist molding, or other encasement structure.

It has been discovered that employment of the side packages 302 improves end line production yield. This is accomplished by using side packages 302 that are self-contained and can be tested to ensure that these are known good packages prior to integration and mounting into the integrated circuit packaging system 300.

The side packages 302 are shown mounted to the base substrate 308 with a second adhesive 320. The second adhesive 320 can be a resin, glue, paste, cement, putty, or a polyvinyl resin emulsion used to mechanically secure the side packages 302 to the base substrate 308. The side packages 302 are mounted with the side package encapsulation 318 facing the base substrate 308 and the side package substrate 310 facing away from the base substrate 308. The side packages 302 can be electrically connected from above with first interconnects 322. The first interconnects 322 can be bond wires made from gold or aluminum and attached to the side package substrate 310 and the base substrate 308 with thermal compression or ultrasonic welding along the peripheral region 306 of the base substrate 308.

Formed above the side packages 302 are first vertical connectors 323. The first vertical connectors 323 can be solder balls, copper pillars, or other conductive interconnects suitable for vertical connection while providing a standoff height for connections within the integrated circuit packaging system 300.

It has been unexpectedly found that the first vertical connectors 323 increase input/output (I/O) count of the integrated circuit packaging system 300 when used in conjunction with the side packages 302. This further allows for increased integrated circuit density, greater functionality, and greater design flexibility of the integrated circuit packaging system 300.

The side packages 302 are mounted laterally peripheral to the central integrated circuit 304. The central integrated circuit 304 can be mounted above a central region 324 of the base substrate 308. The central region 324 is not necessarily at the center of the integrated circuit packaging system 300 but the intended to depict that it is a region between the location of the side packages 302. The central integrated circuit 304 is electrically connected to the side packages 302 with second interconnects 325 along outer edges 326 and on an active side 328 of the central integrated circuit 304. The active side 328 has of the central integrated circuit 304 has active circuitry fabricated thereon and is shown mounted facing away from the base substrate 308. For the purposes of this application, active circuitry is defined as including transistor elements.

The central integrated circuit 304 can be bridge connected to the base substrate 308 by routing signals through the second interconnects 325, through the side package substrates 310, and through the first interconnects 322 to the base substrate 308. For the purposes of this application, bridge connection is defined as an electrical connection utilizing elements that serve as a redistribution layer across disparate devices.

The side packages 302 may be bridge connected together through the first interconnects 322 and through the base substrate 308 to electrically connect the side packages 302 mounted on the peripheral regions 306 together. The side packages 302 may also be bridge connected by the second interconnects 325 and through the central integrated circuit 304. In this example, the central integrated circuit 304 is a disparate device and serves as a redistribution layer.

The active side 328 of the central integrated circuit 304 is further shown having second vertical connectors 329 formed thereon. The second vertical connectors 329 can be solder balls, copper pillars, or other conductive interconnects suitable for vertical connection while providing a standoff height for connections within the integrated circuit packaging system 300.

It has been unexpectedly found that the second vertical connectors 329 above the central integrated circuit 304 increases input/output (I/O) count of the integrated circuit packaging system 300 when used in conjunction with the central integrated circuit 304. This further allows for increased integrated circuit density, greater functionality, and greater design flexibility of the integrated circuit packaging system 300.

The central integrated circuit 304 is further shown mounted above a base integrated circuit 330. The base integrated circuit 330 can be a flip-chip having an active side 332 with active circuitry fabricated thereon. The active side 332 of the base integrated circuit 330 faces toward the base substrate 308 and is connected thereto with third interconnects 333.

The third interconnects 333 can be solder bumps. The central integrated circuit 304 can be attached to the base integrated circuit 330 with a third adhesive 334. The third adhesive 334 can be a resin, glue, paste, cement, putty, or a polyvinyl resin emulsion. An under-fill 336 is shown attaching and filling between the base integrated circuit 330 to the base substrate 308. The under-fill 336 can be a resin, glue, paste, cement, putty, or a polyvinyl resin emulsion.

The base integrated circuit 330 may be bridge connected to the side packages 302 through the third interconnects 333, through the base substrate 308, and through the first interconnects 322. The base integrated circuit 330 may also be bridge connected to the central integrated circuit 304 through the base substrate 308, the first interconnects 322, the side packages 302, and the second interconnects 325.

The side package substrates 310 are shown in direct contact with the central integrated circuit 304. The side package substrates 310 can induce a compressive stress in the central integrated circuit 304. The compressive stress induced within the central integrated circuit 304 can prevent decoupling between the central integrated circuit 304 and the second vertical connectors 329.

The direct contact between the side package substrates 310 and the central integrated circuit 304 can provide alignment or positioning of the first vertical connectors 323 and the second vertical connectors 329. The alignment of the first vertical connectors 323 and the second vertical connectors 329 can be from ensuring dimensions of the side packages 302 and of the central integrated circuit 304.

The central integrated circuit 304 has a height 337 from the base substrate 308 to the active side 328 of the central integrated circuit 304. The height 337 of the central integrated circuit 304 is the same as a height 338 from the base substrate 308 to the top of the side package substrate 310.

The side packages 302 and the central integrated circuit 304 can be encapsulated with a base encapsulation 339. The base encapsulation 339 is an encapsulation and can be glob top, film assist molding, or other encasement structure. The base encapsulation 339 forms a planar surface 340 with the first vertical connectors 323 and the second vertical connectors 329.

It has been unexpectedly found that the planar surface 340 makes it possible to achieve a very low profile of the integrated circuit packaging system 300. This very low profile has been discovered to improve integration of the integrated circuit packaging system 300 into portable electronic device that require slim designs along with a high level of functional integration, such as a cellphone or computer.

The base encapsulation 339 is shown encapsulating the first vertical connectors 323 above the side packages 302 and also encapsulates the second vertical connectors 329 above the central integrated circuit 304. The first vertical connectors 323 and the second vertical connectors 329 are exposed from the planar surface 340 and form connection points 341 for connection to a stacked package 342 or alternatively to other external components (not shown).

Within the integrated circuit packaging system 300 the side packages 302 and the central integrated circuit 304 are shown having co-planar top surfaces. The connection points 341 can be bridge connected to the side packages 302, to the central integrated circuit 304, to the base substrate 308, or to the base integrated circuit 330.

It has been discovered that designing the central integrated circuit 304 and the side packages 302 having co-planar surfaces decreases processing time since a standard size of vertical connectors can be used. Since the first vertical connectors 323 and the second vertical connectors 329 have the virtue of being the same size, they may also be made during the same phase of manufacture.

It has been unexpectedly found that that designing the co-planar surfaces of the central integrated circuit 304 and the side packages 302 decreases the length of the second interconnects 325. Decreasing the length of the second interconnects 325 between the central integrated circuit 304 and the side packages 302 decreases parasitic inductance within the second interconnects 325 and allows for more robust transmission of high frequency signals.

Below the base substrate 308 are mounted external interconnects 343 such as solder balls. The stacked package 342 is shown mounted above the planar surface 340 and electrically connected thereto with solder balls 344. The stacked package 342 is shown having a stacked package substrate 346 with a stacked package integrated circuit 348 attached thereto with a stacked package adhesive 349. The stacked package integrated circuit 348 is electrically connected from above to the stacked package substrate 346 with stacked package interconnects 350. The stacked package interconnects 350 can be bond wires made from gold or aluminum and attached with thermal compression or ultrasonic welding. A stacked package encapsulation 352 encapsulates the stacked package integrated circuit 348 and the stacked package interconnects 350.

Figure 4:
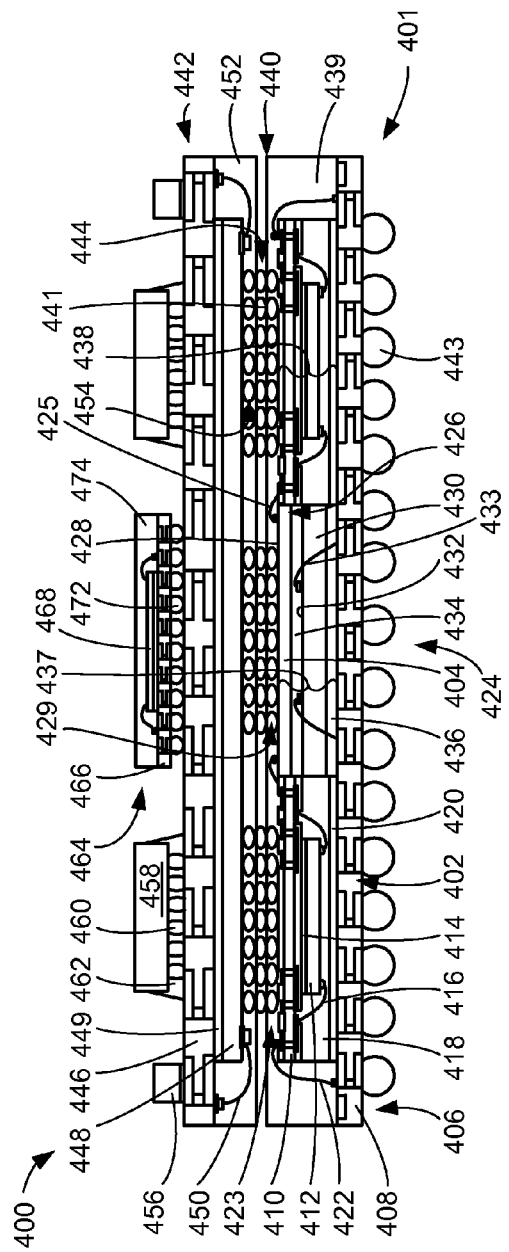
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 is shown having a base package 401. The base package 401 includes side packages 402 and a central integrated circuit 404, for example. As an exemplary illustration, the integrated circuit packaging system 400 can generally be used within a portable electronic device that requires a high level of functional integration, such as a cellphone or computer. Furthermore, by way of example, the integrated circuit packaging system 400 can be referred to as a collapsed multi-integration package structure.

The side packages 402 are integrated circuit packages mounted on a peripheral region 406 of a base substrate 408. For the purposes of this application, substrate is defined as a physical material on which a microcircuit device is fabricated. The base substrate 408 can be a laminated plastic, ceramic, glass, or ferrite substrate.

The side packages 402 can be integrated circuit packages including a side package substrate 410, and can be a laminated plastic, ceramic, glass, or ferrite substrate. The side packages 402 may also include a side package integrated circuit 412 mounted below the side package substrate 410 and attached with an adhesive 414. For the purposes of this application, adhesive is defined as a substance used to bond two or more solid elements so that they may be used as a single piece. The adhesive 414 can be a resin, glue, paste, cement, putty, or a polyvinyl resin emulsion.

The side package integrated circuit 412 can be electrically connected to the side package substrate 410 with side package interconnects 416. The side package interconnects 416 can be bond wires made from gold or aluminum and attached to a side package integrated circuit 412 and the side package substrate 410 with thermal compression or ultrasonic welding.

The side packages 402 are further shown having a side package encapsulation 418. The side package encapsulation 418 encapsulates the side package integrated circuit 412 and the side package interconnects 416 below the side package substrate 410. For the purposes of this application, encapsulation is defined as a structure that protects sensitive components from moisture, dust and other contamination. The side package encapsulation 418 can be glob top, film assist molding, or other encasement structure.

It has been discovered that employment of the side packages 402 improves end line production yield. This is accomplished by using side packages 402 that are self-contained and can be tested to ensure that these are known good packages prior to integration and mounting into the integrated circuit packaging system 400.

The side packages 402 are shown mounted to the base substrate 408 with a second adhesive 420. The second adhesive 420 can be a resin, glue, paste, cement, putty, or a polyvinyl resin emulsion used to mechanically secure the side packages 402 to the base substrate 408. The side packages 402 are mounted with the side package encapsulation 418 facing the base substrate 408 and the side package substrate 410 facing away from the base substrate 408. The side packages 402 can be electrically connected from above with first interconnects 422. The first interconnects 422 can be bond wires made from gold or aluminum and attached to the side package substrate 410 and the base substrate 408 with thermal compression or ultrasonic welding along the peripheral region 406 of the base substrate 408.

Formed above the side packages 402 are first vertical connectors 423. The first vertical connectors 423 can be solder balls, copper pillars, or other conductive interconnects suitable for vertical connection while providing a standoff height for connections within the integrated circuit packaging system 400.

It has been unexpectedly found that the first vertical connectors 423 increase input/output (I/O) count of the integrated circuit packaging system 400 when used in conjunction with the side packages 402. This further allows for increased integrated circuit density, greater functionality, and greater design flexibility of the integrated circuit packaging system 400.

The side packages 402 are mounted laterally peripheral to the central integrated circuit 404. The central integrated circuit 404 can be mounted above a central region 424 of the base substrate 408. The central region 424 is not necessarily at the center of the integrated circuit packaging system 400 but the intended to depict that it is a region between the location of the side packages 402. The central integrated circuit 404 is electrically connected to the side packages 402 with second interconnects 425 along outer edges 426 and on an active side 428 of the central integrated circuit 404. The active side 428 has of the central integrated circuit 404 has active circuitry fabricated thereon and is shown mounted facing away from the base substrate 408. For the purposes of this application, active circuitry is defined as including transistor elements.

The central integrated circuit 404 can be bridge connected to the base substrate 408 by routing signals through the second interconnects 425, through the side package substrates 410, and through the first interconnects 422 to the base substrate 408. For the purposes of this application, bridge connection is defined as an electrical connection utilizing elements that serve as a redistribution layer across disparate devices.

The side packages 402 may be bridge connected together through the first interconnects 422 and through the base substrate 408 to electrically connect the side packages 402 mounted on the peripheral regions 406 together. The side packages 402 may also be bridge connected by the second interconnects 425 and through the central integrated circuit 404. In this example, the central integrated circuit 404 is a disparate device and serves as a redistribution layer.

The active side 428 of the central integrated circuit 404 is further shown having second vertical connectors 429 formed thereon. The second vertical connectors 429 can be solder balls, copper pillars, or other conductive interconnects suitable for vertical connection while providing a standoff height for connections within the integrated circuit packaging system 400.

It has been unexpectedly found that the second vertical connectors 429 above the central integrated circuit 404 increases input/output (I/O) count of the integrated circuit packaging system 400 when used in conjunction with the central integrated circuit 404. This further allows for increased integrated circuit density, greater functionality, and greater design flexibility of the integrated circuit packaging system 400.

The central integrated circuit 404 is further shown mounted above a base integrated circuit 430. The base integrated circuit 430 can be a wire-bonded die having an active side 432 with active circuitry fabricated thereon. The active side 432 of the base integrated circuit 430 faces away from the base substrate 408 and is connected thereto with third interconnects 433.

The third interconnects 433 can be bond wires made from gold or aluminum and attached to the active side 432 of the base integrated circuit 430 and the base substrate 408 with thermal compression or ultrasonic welding. The central integrated circuit 404 can be attached to the active side 432 of the base integrated circuit 430 with a third adhesive 434. The third adhesive 434 can be a resin, glue, paste, cement, putty, or a polyvinyl resin emulsion.

The third interconnects 433 connecting the base integrated circuit 430 can be connected to the base integrated circuit 430 beyond a horizontal edge of the central integrated circuit 404 so that the third interconnects 433 do not make contact with the central integrated circuit 404. A fourth adhesive 436 is shown attaching the base integrated circuit 430 to the base substrate 408. The fourth adhesive 436 can be a resin, glue, paste, cement, putty, or a polyvinyl resin emulsion.

The base integrated circuit 430 may be bridge connected to the side packages 402 through the third interconnects 433, through the base substrate 408, and through the first interconnects 422. The base integrated circuit 430 may also be bridge connected to the central integrated circuit 404 through the base substrate 408, the first interconnects 422, the side packages 402, and the second interconnects 425.

The side package substrates 410 are shown in direct contact with the central integrated circuit 404. The side package substrates 410 can induce a compressive stress in the central integrated circuit 404. The compressive stress induced within the central integrated circuit 404 can prevent decoupling between the central integrated circuit 404 and the second vertical connectors 429.

The direct contact between the side package substrates 410 and the central integrated circuit 404 can provide alignment or positioning of the first vertical connectors 423 and the second vertical connectors 429. The alignment of the first vertical connectors 423 and the second vertical connectors 429 can be from ensuring dimensions of the side packages 402 and of the central integrated circuit 404.

The central integrated circuit 404 has a height 437 from the base substrate 408 to the active side 428 of the central integrated circuit 404. The height 437 of the central integrated circuit 404 is the same as a height 438 from the base substrate 408 to the top of the side package substrate 410.

The side packages 402 and the central integrated circuit 404 can be encapsulated with a base encapsulation 439. The base encapsulation 439 is an encapsulation and can be glob top, film assist molding, or other encasement structure. The base encapsulation 439 forms a planar surface 440 with the first vertical connectors 423 and the second vertical connectors 429.

It has been unexpectedly found that the planar surface 440 makes it possible to achieve a very low profile of the integrated circuit packaging system 400. This very low profile has been discovered to improve integration of the integrated circuit packaging system 400 into portable electronic device that require slim designs along with a high level of functional integration, such as a cellphone or computer.

The base encapsulation 439 is shown encapsulating the first vertical connectors 423 above the side packages 402 and also encapsulates the second vertical connectors 429 above the central integrated circuit 404. The first vertical connectors 423 and the second vertical connectors 429 are exposed from the planar surface 440 and form connection points 441 for connection to a stacked package 442 or alternatively to other external components (not shown).

Within the integrated circuit packaging system 400 the side packages 402 and the central integrated circuit 404 are shown having co-planar top surfaces. The connection points 441 can be bridge connected to the side packages 402, to the central integrated circuit 404, to the base substrate 408, or to the base integrated circuit 430.

It has been discovered that designing the central integrated circuit 404 and the side packages 402 having co-planar surfaces decreases processing time since a standard size of vertical connectors can be used. Since the first vertical connectors 423 and the second vertical connectors 429 have the virtue of being the same size, they may also be made during the same phase of manufacture.

It has been unexpectedly found that that designing the co-planar surfaces of the central integrated circuit 404 and the side packages 402 decreases the length of the second interconnects 425. Decreasing the length of the second interconnects 425 between the central integrated circuit 404 and the side packages 402 decreases parasitic inductance within the second interconnects 425 and allows for more robust transmission of high frequency signals.

Below the base substrate 408 are mounted external interconnects 443 such as solder balls. The stacked package 442 is shown mounted above the planar surface 440 and electrically connected thereto with solder balls 444. The stacked package 442 is shown having a stacked package substrate 446 with a stacked package integrated circuit 448 attached thereto with a stacked package adhesive 449. The stacked package integrated circuit 448 is electrically connected from above to the stacked package substrate 446 with stacked package interconnects 450. The stacked package interconnects 450 can be bond wires made from gold or aluminum and attached with thermal compression or ultrasonic welding. A stacked package encapsulation 452 encapsulates the stacked package integrated circuit 448 and the stacked package interconnects 450.

The stacked package substrate 446 is mounted facing away from the base encapsulation 439 and with the stacked package encapsulation 452 facing toward the base encapsulation 439. The stacked package encapsulation 452 is further shown partially encapsulating embedded solder balls 454 mounted and electrically connected to the stacked package integrated circuit 448 and electrically connected to the solder balls 444.

Mounted above the stacked package 442 and electrically connected to the stacked package substrate 446 are passive components 456 such as resistors, capacitors, or inductors. Also mounted above the stacked package substrate 446 are flip-chips 458. The flip-chips 458 are electrically connected to the stacked package substrate 446 with flip-chip solder bumps 460 and are supported and attached with under-fill 462 filling between the flip-chips 458 and the stacked package substrate 446.

Lastly, an external package 464 having an external package substrate 466 and an external package integrated circuit 468 mounted there over is electrically connected to the stacked package substrate 446 with external package solder balls 472. The external package 464 can be encapsulated with an external package encapsulation 474 that protects the external package integrated circuit 468.

Figure 5:
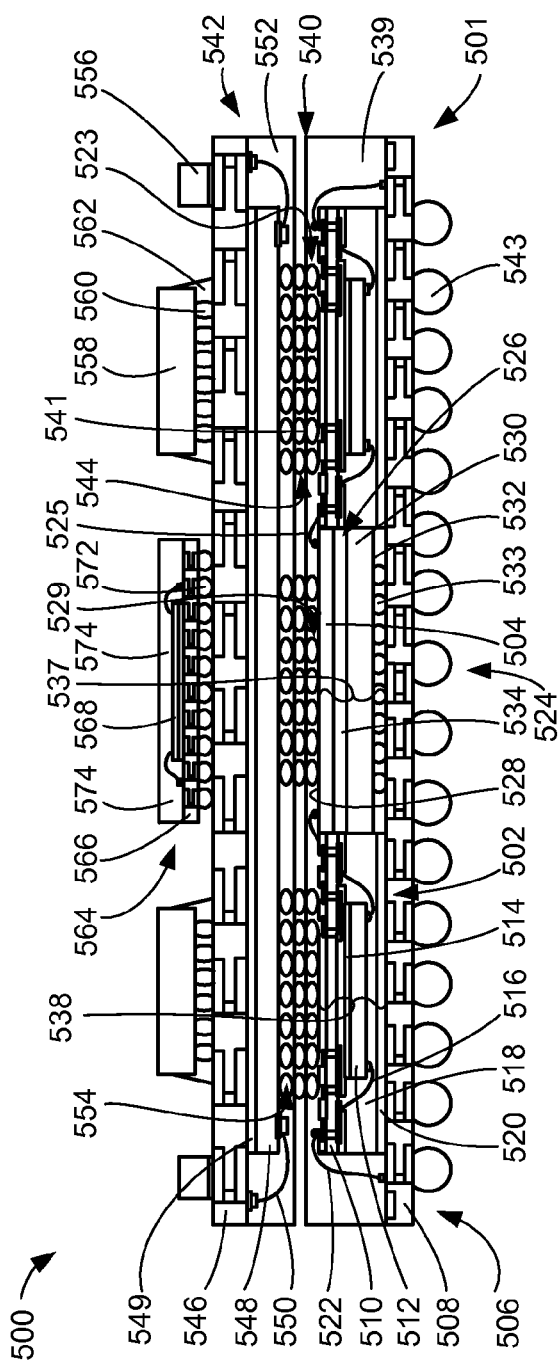
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The integrated circuit packaging system 500 is shown having a base package 501. The base package 501 includes side packages 502 and a central integrated circuit 504, for example. As an exemplary illustration, the integrated circuit packaging system 500 can generally be used within a portable electronic device that requires a high level of functional integration, such as a cellphone or computer. Furthermore, by way of example, the integrated circuit packaging system 500 can be referred to as a collapsed multi-integration package structure.

The side packages 502 are integrated circuit packages mounted on a peripheral region 506 of a base substrate 508. For the purposes of this application, substrate is defined as a physical material on which a microcircuit device is fabricated. The base substrate 508 can be a laminated plastic, ceramic, glass, or ferrite substrate.

The side packages 502 can be integrated circuit packages including a side package substrate 510, and can be a laminated plastic, ceramic, glass, or ferrite substrate. The side packages 502 may also include a side package integrated circuit 512 mounted below the side package substrate 510 and attached with an adhesive 514. For the purposes of this application, adhesive is defined as a substance used to bond two or more solid elements so that they may be used as a single piece. The adhesive 514 can be a resin, glue, paste, cement, putty, or a polyvinyl resin emulsion.

The side package integrated circuit 512 can be electrically connected to the side package substrate 510 with side package interconnects 516. The side package interconnects 516 can be bond wires made from gold or aluminum and attached to a side package integrated circuit 512 and the side package substrate 510 with thermal compression or ultrasonic welding.

The side packages 502 are further shown having a side package encapsulation 518. The side package encapsulation 518 encapsulates the side package integrated circuit 512 and the side package interconnects 516 below the side package substrate 510. For the purposes of this application, encapsulation is defined as a structure that protects sensitive components from moisture, dust and other contamination. The side package encapsulation 518 can be glob top, film assist molding, or other encasement structure.

It has been discovered that employment of the side packages 502 improves end line production yield. This is accomplished by using side packages 502 that are self-contained and can be tested to ensure that these are known good packages prior to integration and mounting into the integrated circuit packaging system 500.

The side packages 502 are shown mounted to the base substrate 508 with a second adhesive 520. The second adhesive 520 can be a resin, glue, paste, cement, putty, or a polyvinyl resin emulsion used to mechanically secure the side packages 502 to the base substrate 508. The side packages 502 are mounted with the side package encapsulation 518 facing the base substrate 508 and the side package substrate 510 facing away from the base substrate 508. The side packages 502 can be electrically connected from above with first interconnects 522. The first interconnects 522 can be bond wires made from gold or aluminum and attached to the side package substrate 510 and the base substrate 508 with thermal compression or ultrasonic welding along the peripheral region 506 of the base substrate 508.

Formed above the side packages 502 are first vertical connectors 523. The first vertical connectors 523 can be solder balls, copper pillars, or other conductive interconnects suitable for vertical connection while providing a standoff height for connections within the integrated circuit packaging system 500.

It has been unexpectedly found that the first vertical connectors 523 increase input/output (I/O) count of the integrated circuit packaging system 500 when used in conjunction with the side packages 502. This further allows for increased integrated circuit density, greater functionality, and greater design flexibility of the integrated circuit packaging system 500.

The side packages 502 are mounted laterally peripheral to the central integrated circuit 504. The central integrated circuit 504 can be mounted above a central region 524 of the base substrate 508. The central region 524 is not necessarily at the center of the integrated circuit packaging system 500 but the intended to depict that it is a region between the location of the side packages 502. The central integrated circuit 504 is electrically connected to the side packages 502 with second interconnects 525 along outer edges 526 and on an active side 528 of the central integrated circuit 504. The active side 528 has of the central integrated circuit 504 has active circuitry fabricated thereon and is shown mounted facing away from the base substrate 508. For the purposes of this application, active circuitry is defined as including transistor elements.

The central integrated circuit 504 can be bridge connected to the base substrate 508 by routing signals through the second interconnects 525, through the side package substrates 510, and through the first interconnects 522 to the base substrate 508. For the purposes of this application, bridge connection is defined as an electrical connection utilizing elements that serve as a redistribution layer across disparate devices.

The side packages 502 may be bridge connected together through the first interconnects 522 and through the base substrate 508 to electrically connect the side packages 502 mounted on the peripheral regions 506 together. The side packages 502 may also be bridge connected by the second interconnects 525 and through the central integrated circuit 504. In this example, the central integrated circuit 504 is a disparate device and serves as a redistribution layer.

The active side 528 of the central integrated circuit 504 is further shown having second vertical connectors 529 formed thereon. The second vertical connectors 529 can be solder balls, copper pillars, or other conductive interconnects suitable for vertical connection while providing a standoff height for connections within the integrated circuit packaging system 500.

It has been unexpectedly found that the second vertical connectors 529 above the central integrated circuit 504 increases input/output (I/O) count of the integrated circuit packaging system 500 when used in conjunction with the central integrated circuit 504. This further allows for increased integrated circuit density, greater functionality, and greater design flexibility of the integrated circuit packaging system 500.

The central integrated circuit 504 is further shown mounted above a base integrated circuit 530. The base integrated circuit 530 can be a flip-chip having an active side 532 with active circuitry fabricated thereon. The active side 532 of the base integrated circuit 530 faces toward the base substrate 508 and is connected thereto with third interconnects 533. The third interconnects 533 can be solder bumps. The central integrated circuit 504 can be attached to the base integrated circuit 530 with a third adhesive 534. The third adhesive 534 can be a resin, glue, paste, cement, putty, or a polyvinyl resin emulsion.

The base integrated circuit 530 may be bridge connected to the side packages 502 through the third interconnects 533, through the base substrate 508, and through the first interconnects 522. The base integrated circuit 530 may also be bridge connected to the central integrated circuit 504 through the base substrate 508, the first interconnects 522, the side packages 502, and the second interconnects 525.

The side package substrates 510 are shown in direct contact with the central integrated circuit 504. The side package substrates 510 can induce a compressive stress in the central integrated circuit 504. The compressive stress induced within the central integrated circuit 504 can prevent decoupling between the central integrated circuit 504 and the second vertical connectors 529.

The direct contact between the side package substrates 510 and the central integrated circuit 504 can provide alignment or positioning of the first vertical connectors 523 and the second vertical connectors 529. The alignment of the first vertical connectors 523 and the second vertical connectors 529 can be from ensuring dimensions of the side packages 502 and of the central integrated circuit 504.

The central integrated circuit 504 has a height 537 from the base substrate 508 to the active side 528 of the central integrated circuit 504. The height 537 of the central integrated circuit 504 is the same as a height 538 from the base substrate 508 to the top of the side package substrate 510.

The side packages 502 and the central integrated circuit 504 can be encapsulated with a base encapsulation 539. The base encapsulation 539 is an encapsulation and can be glob top, film assist molding, or other encasement structure. The base encapsulation 539 forms a planar surface 540 with the first vertical connectors 523 and the second vertical connectors 529.

It has been unexpectedly found that the planar surface 540 makes it possible to achieve a very low profile of the integrated circuit packaging system 500. This very low profile has been discovered to improve integration of the integrated circuit packaging system 500 into portable electronic device that require slim designs along with a high level of functional integration, such as a cellphone or computer.

The base encapsulation 539 is shown encapsulating the first vertical connectors 523 above the side packages 502 and also encapsulates the second vertical connectors 529 above the central integrated circuit 504. The first vertical connectors 523 and the second vertical connectors 529 are exposed from the planar surface 540 and form connection points 541 for connection to a stacked package 542 or alternatively to other external components (not shown).

Within the integrated circuit packaging system 500 the side packages 502 and the central integrated circuit 504 are shown having co-planar top surfaces. The connection points 541 can be bridge connected to the side packages 502, to the central integrated circuit 504, to the base substrate 508, or to the base integrated circuit 530.

It has been discovered that designing the central integrated circuit 504 and the side packages 502 having co-planar surfaces decreases processing time since a standard size of vertical connectors can be used. Since the first vertical connectors 523 and the second vertical connectors 529 have the virtue of being the same size, they may also be made during the same phase of manufacture.

It has been unexpectedly found that that designing the co-planar surfaces of the central integrated circuit 504 and the side packages 502 decreases the length of the second interconnects 525. Decreasing the length of the second interconnects 525 between the central integrated circuit 504 and the side packages 502 decreases parasitic inductance within the second interconnects 525 and allows for more robust transmission of high frequency signals.

Below the base substrate 508 are mounted external interconnects 543 such as solder balls. The stacked package 542 is shown mounted above the planar surface 540 and electrically connected thereto with solder balls 544. The stacked package 542 is shown having a stacked package substrate 546 with a stacked package integrated circuit 548 attached thereto with a stacked package adhesive 549. The stacked package integrated circuit 548 is electrically connected from above to the stacked package substrate 546 with stacked package interconnects 550. The stacked package interconnects 550 can be bond wires made from gold or aluminum and attached with thermal compression or ultrasonic welding. A stacked package encapsulation 552 encapsulates the stacked package integrated circuit 548 and the stacked package interconnects 550.

The stacked package substrate 546 is mounted facing away from the base encapsulation 539 and with the stacked package encapsulation 552 facing toward the base encapsulation 539. The stacked package encapsulation 552 is further shown partially encapsulating embedded solder balls 554 mounted and electrically connected to the stacked package integrated circuit 548 and electrically connected to the solder balls 544.

Mounted above the stacked package 542 and electrically connected to the stacked package substrate 546 are passive components 556 such as resistors, capacitors, or inductors. Also mounted above the stacked package substrate 546 are flip-chips 558. The flip-chips 558 are electrically connected to the stacked package substrate 546 with flip-chip solder bumps 560 and are supported and attached with under-fill 562 filling between the flip-chips 558 and the stacked package substrate 546.

Lastly, an external package 564 having an external package substrate 566 and an external package integrated circuit 568 mounted there over is electrically connected to the stacked package substrate 546 with external package solder balls 572. The external package 564 can be encapsulated with an external package encapsulation 574 that protects the external package integrated circuit 568.

Figure 6:
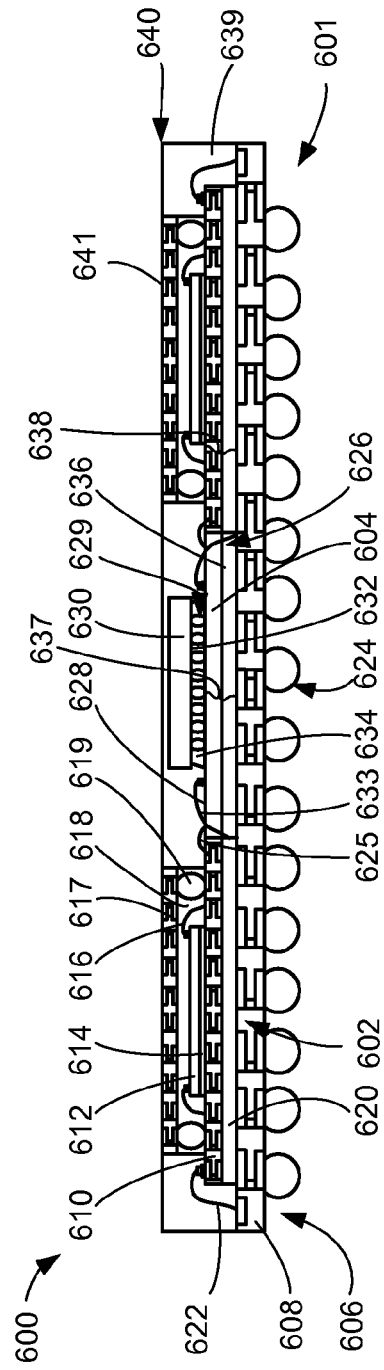
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. The integrated circuit packaging system 600 is shown having a base package 601. The base package 601 includes side packages 602 and a central integrated circuit 604, for example. As an exemplary illustration, the integrated circuit packaging system 600 can generally be used within a portable electronic device that requires a high level of functional integration, such as a cellphone or computer. Furthermore, by way of example, the integrated circuit packaging system 600 can be referred to as a collapsed multi-integration package structure.

The side packages 602 are integrated circuit packages mounted on a peripheral region 606 of a base substrate 608. For the purposes of this application, substrate is defined as a physical material on which a microcircuit device is fabricated. The base substrate 608 can be a laminated plastic, ceramic, glass, or ferrite substrate.

The side packages 602 can be integrated circuit packages including a first side package substrate 610. The first side package substrate 610 can be a laminated plastic, ceramic, glass, or ferrite substrate. The side packages 602 may also include a side package integrated circuit 612 mounted above the first side package substrate 610 and attached with an adhesive 614. For the purposes of this application, adhesive is defined as a substance used to bond two or more solid elements so that they may be used as a single piece. The adhesive 614 can be a resin, glue, paste, cement, putty, or a polyvinyl resin emulsion.

The side package integrated circuit 612 can be electrically connected to the first side package substrate 610 with side package interconnects 616 such as bond wires within the side packages 602. The side package interconnects 616 can be bond wires made from gold or aluminum and attached to a side package integrated circuit 612 and the first side package substrate 610 with thermal compression or ultrasonic welding.

The side packages 602 are further shown having a second side package substrate 617 connected to the first side package substrate 610 through a side package encapsulation 618 with a side package vertical interconnect 619. The side package vertical interconnect 619 can be a solder ball, a copper pillar, or other vertical conductive element that vertically transverses the side package encapsulation 618 to directly and electrically connect the first side package substrate 610 to the second side package substrate 617.

The second side package substrate 617 can be a laminated plastic, ceramic, glass, or ferrite substrate. The side package encapsulation 618 can be glob top, film assist molding, or other encasement structure and encapsulates the side package integrated circuit 612, the side package vertical interconnects 619 and the side package interconnects 616.

It has been discovered that employment of the side packages 602 improves end line production yield. This is accomplished by using side packages 602 that are self-contained and can be tested to ensure that these are known good packages prior to integration and mounting into the integrated circuit packaging system 600.

The side packages 602 are shown mounted to the base substrate 608 with a second adhesive 620. The second adhesive 620 can be a resin, glue, paste, cement, putty, or a polyvinyl resin emulsion used to mechanically secure the side packages 602 to the base substrate 608. The side packages 602 can be electrically connected from above the first side package substrate 610 with first interconnects 622. The first interconnects 622 can be bond wires made from gold or aluminum and attached to the first side package substrate 610 and the base substrate 608 with thermal compression or ultrasonic welding along the peripheral region 606 of the base substrate 608.

It has been unexpectedly found that the second side package substrate 617 increase input/output (I/O) count of the integrated circuit packaging system 600. This allows for increased integrated circuit density, greater functionality, and greater design flexibility of the integrated circuit packaging system 600.

The side packages 602 are mounted laterally peripheral to the central integrated circuit 604. The central integrated circuit 604 can be mounted above a central region 624 of the base substrate 608. The central region 624 is not necessarily at the center of the integrated circuit packaging system 600 but the intended to depict that it is a region between the location of the side packages 602. The central integrated circuit 604 is electrically connected to the side packages 602 with second interconnects 625 along outer edges 626 and on an active side 628 of the central integrated circuit 604. The active side 628 has of the central integrated circuit 604 has active circuitry fabricated thereon and is shown mounted facing away from the base substrate 608. For the purposes of this application, active circuitry is defined as including transistor elements.

The central integrated circuit 604 can be bridge connected to the base substrate 608 by routing signals through second interconnects 625, through the first side package substrates 610, and through the first interconnects 622 to the base substrate 608. For the purposes of this application, bridge connection is defined as an electrical connection utilizing elements that serve as a redistribution layer across disparate devices.

The side packages 602 may be bridge connected together through the first interconnects 622 and through the base substrate 608 to electrically connect the side packages 602 mounted on the peripheral regions 606 together. The side packages 602 may also be bridge connected by the second interconnects 625 and through the central integrated circuit 604. In this example, the central integrated circuit 604 is a disparate device and serves as a redistribution layer.

The active side 628 of the central integrated circuit 604 is further shown having vertical connectors 629 formed thereon. The vertical connectors 629 can be solder balls, copper pillars, or other conductive interconnects suitable for vertical connection while providing a standoff height for connections within the integrated circuit packaging system 600.

The central integrated circuit 604 is further shown below a base integrated circuit 630. The base integrated circuit 630 can be a flip-chip having an active side 632 with active circuitry fabricated thereon. The active side 632 of the base integrated circuit 630 faces toward the base substrate 608 and is connected to the central integrated circuit 604 with the vertical connectors 629.

The central integrated circuit 604 can be connected to the base substrate 608 with third interconnects 633 along the outer edges 626 and on the active side 628 of the central integrated circuit 604. The active side 628 of the central integrated circuit 604 is shown mounted facing away from the base substrate 608.

The third interconnects 633 can be bond wires made from gold or aluminum and attached with thermal compression or ultrasonic welding. The central integrated circuit 604 can be attached to the base integrated circuit 630 with an under-fill 634.

The under-fill 634 can be a resin, glue, paste, cement, putty, or a polyvinyl resin emulsion. A fourth adhesive 636 is shown attaching the central integrated circuit 604 to the base substrate 608. The fourth adhesive 636 can be a resin, glue, paste, cement, putty, or a polyvinyl resin emulsion. The base integrated circuit 630 may be bridge connected to the side packages 602 through the third interconnects 633.

The first side package substrates 610 are shown in direct contact with the central integrated circuit 604. The first side package substrates 610 can induce a compressive stress in the central integrated circuit 604. The compressive stress induced within the central integrated circuit 604 can prevent decoupling between the central integrated circuit 604 and the vertical connectors 629.

The direct contact between the first side package substrates 610 and the central integrated circuit 604 can provide alignment or positioning of the vertical connectors 629. The alignment of the vertical connectors 629 can be from ensuring dimensions of the side packages 602 and of the central integrated circuit 604.

The central integrated circuit 604 has a height 637 from the base substrate 608 to the active side 628 of the central integrated circuit 604. The height 637 of the central integrated circuit 604 is the same as a height 638 from the base substrate 608 to the top of the first side package substrate 610.

The side packages 602 and the central integrated circuit 604 are encapsulated with a base encapsulation 639. The base encapsulation 639 is an encapsulation and can be glob top, film assist molding, or other encasement structure. The base encapsulation 639 forms a planar surface 640 with the second side package substrate 617.

It has been unexpectedly found that the planar surface 640 makes it possible to achieve a very low profile of the integrated circuit packaging system 600. This very low profile has been discovered to improve integration of the integrated circuit packaging system 600 into portable electronic device that require slim designs along with a high level of functional integration, such as a cellphone or computer.

The base encapsulation 639 is shown encapsulating the second side package substrate 617 and also encapsulates the vertical connectors 629 above the central integrated circuit 604. The second side package substrate 617 is exposed from the planar surface 640 and form connection points 641 for connection external components or packages (not shown).

Within the integrated circuit packaging system 600 the first side package substrate 610 and the central integrated circuit 604 are shown having co-planar top surfaces. The connection points 641 can be bridge connected to the side packages 602, to the central integrated circuit 604, to the base substrate 608, or to the base integrated circuit 630.

It has been unexpectedly found that that designing the co-planar surfaces of the central integrated circuit 604 and the side packages 602 decreases the length of the second interconnects 625. Decreasing the length of the second interconnects 625 between the central integrated circuit 604 and the side packages 602 decreases parasitic inductance within the second interconnects 625 and allows for more robust transmission of high frequency signals.

Figure 7:
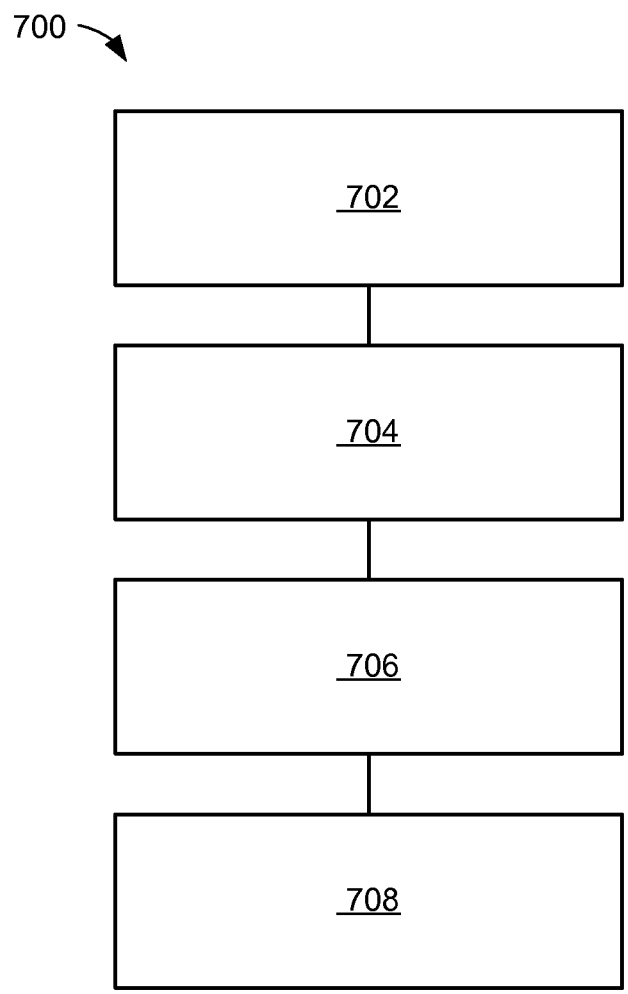
FIG. 7 is a flow chart of a method of manufacture of the integrated circuit packaging system of FIG. 1 in a further embodiment of the present invention.

Referring now to FIG. 7, therein is shown a flow chart of a method 700 of manufacture of the integrated circuit packaging system 100 of FIG. 1 in a further embodiment of the present invention. The method 700 includes: providing a base substrate in a block 702; mounting a central integrated circuit over the base substrate in a block 704; mounting a side package having a side package substrate along a peripheral region of the base substrate and laterally peripheral to the central integrated circuit with the side package substrate coplanar with the central integrated circuit in a block 706; and encapsulating the central integrated circuit and the side package above the base substrate with a base encapsulation to form a planar surface over the central integrated circuit and the side package facing away from the base substrate in a block 708.

Thus, it has been discovered that the fan in interposer on lead system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate;

mounting a central integrated circuit over the base substrate;

mounting a side package having side package substrate along a peripheral region of the base substrate and laterally peripheral to the central integrated circuit with the side package substrate coplanar and in direct contact with the central integrated circuit;

forming a first vertical connector above the central integrated circuit;

forming a second vertical connector over the side package substrate, wherein the first vertical connector and the second vertical connector are coplanar; and encapsulating the central integrated circuit and the side package above the base substrate with a base encapsulation to form a planar surface over the central integrated circuit and the side package facing away from the base substrate, the base encapsulation operable to partially encapsulate the first vertical connector and the second vertical connector such that the first vertical connector and the second vertical connector are exposed in the planar surface.

2. The method as claimed in claim 1 wherein:
mounting the central integrated circuit includes mounting the central integrated circuit over the base substrate having a first height from the base substrate to the top of the central integrated circuit; and
mounting the side package along the peripheral region of the base substrate includes mounting the side package having a second height from the base substrate to the top of the side package substrate and the second height is the same as the first height of the central integrated circuit.

3. The method as claimed in claim 1 further comprising:
mounting a base integrated circuit over the base substrate below the central integrated circuit; and
electrically connecting the base substrate to the side packages through the central integrated circuit.

4. The method as claimed in claim 1 further comprising:
electrically connecting the side package to the base substrate with a first interconnect;
electrically connecting the central integrated circuit to the side package with a second interconnect to create an electrical connection from the central integrated circuit to the base substrate through the side package substrate.

5. The method as claimed in claim 1 further comprising:
electrically connecting a stacked package having a stacked package Integrated circuit through the planar surface to the side packages and electrically connected to the base substrate.

6. The method as claimed in claim 1 further comprising:
electrically connecting the side packages through the central integrated circuit.

7. The method as claimed in claim 1 further comprising:
electrically connecting the vertical connector to the side packages or the base substrate.

8. The method as claimed in claim 1 wherein:
mounting the side packages includes mounting the side packages having a second side package substrate electrically connected to the central integrated circuit; and
encapsulating the side packages includes partially encapsulating the second side package substrate.

9. An integrated circuit packaging system comprising:
a base substrate;
a central integrated circuit mounted over the base substrate;
a side package having a side package substrate mounted along a peripheral region of the base substrate and laterally peripheral to the central integrated circuit with the side package substrate coplanar and in direct contact with the central integrated circuit;
a first vertical connector formed over the central integrated circuit;
a second vertical connector formed over the side package substrate, wherein the first vertical connector and the second vertical connector are coplanar; and
a base encapsulation encapsulating the central integrated circuit and the side package above the base substrate and forming a planar surface over the central integrated circuit and the side package facing away from the base substrate, wherein the first vertical connector and the second vertical connector are partially encapsulated in the base encapsulation and exposed in the planar surface.

10. The system as claimed in claim 9 wherein:
the central integrated circuit has a first height from the base substrate to the top of the central integrated circuit; and
the side package has a second height from the base substrate to the top of the side package substrate and the second height is the same as the first height of the central integrated circuit.

11. The system as claimed in claim 9 further comprising:
a base integrated circuit mounted over the base substrate below the central integrated circuit; and
wherein:
the base substrate is electrically connected to the side packages through the central integrated circuit.

12. The system as claimed in claim 9 further comprising:
a first interconnect electrically connecting the side package to the base substrate; and
a second interconnect electrically connecting the central integrated circuit to the side package to create an electrical connection from the central integrated circuit to the base substrate through the side package substrate.

13. The system as claimed in claim 9 further comprising:
a stacked package having a stacked package integrated circuit electrically connected through the planar surface to the side packages and electrically connected to the base substrate.

14. The system as claimed in claim 9
wherein
the side package mounted along the peripheral region of the base substrate includes multiple side packages along the peripheral region and laterally peripheral to the central integrated circuit.

15. The system as claimed in claim 14 wherein:
the side packages are electrically connected through the central integrated circuit.

16. The system as claimed in claim 14 wherein:
the vertical connector is electrically connected to the side packages or the base substrate.

17. The system as claimed in claim 14 wherein:
the side packages have a second side package substrate electrically connected to the central integrated circuit; and
the base encapsulation partially encapsulates the second side package substrate.

* * * * *